United States Patent
Fan et al.

(10) Patent No.: US 7,691,676 B1
(45) Date of Patent: Apr. 6, 2010

(54) MOLD ARRAY PROCESS FOR SEMICONDUCTOR PACKAGES

(75) Inventors: Wen-Jeng Fan, Hsinchu (TW); Li-Chih Fang, Hsinchu (TW); Ji-Cheng Lin, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/271,435

(22) Filed: Nov. 14, 2008

(51) Int. Cl.
*H01L 21/00* (2006.01)

(52) U.S. Cl. .................. 438/112; 438/125; 438/126; 438/127; 257/687; 257/E21.502

(58) Field of Classification Search .................. None
See application file for complete search history.

(56) References Cited

U.S. PATENT DOCUMENTS 7,537,967 B2 * 5/2009 Tsuchida .................. 438/127

FOREIGN PATENT DOCUMENTS

| TW | 1240395 | 9/2005 |
|---|---|---|
| TW | 200818349 | 4/2008 |

* cited by examiner

*Primary Examiner*—Minh N Tang
(74) *Attorney, Agent, or Firm*—Muncy, Geissler, Olds & Lowe, PLLC (57) ABSTRACT

A mold array process (MAP) for manufacturing a plurality of semiconductor packages is revealed. Firstly, a substrate strip including a plurality of substrate units arranged in an array within a molding area is provided. A plurality of chips are disposed on the substrate units. An encapsulant by molding is formed on the molding area of the substrate strip to continuously encapsulate the chips. During the molding process, an adjustable top mold is implemented where a cavity width between two opposing sidewalls inside a top mold chest can be adjusted to make the mold flow speeds at the center and at the side rails of the molding area the same.

11 Claims, 12 Drawing Sheets

MOLD ARRAY PROCESS FOR SEMICONDUCTOR PACKAGES

FIELD OF THE INVENTION

The present invention relates to manufacturing semiconductor devices, and more particularly to a mold array process (MAP) for manufacturing a plurality of semiconductor packages.

BACKGROUND OF THE INVENTION

In order to mass production of semiconductor packages such as BGA (Ball Grid Array) packages, mold array process (MAP) has been widely implemented. During molding processes of MAP, a plurality of substrate units formed within a molding area of a substrate strip are continuously encapsulated by an encapsulant. Mold array process related technologies have been revealed in R.O.C. Taiwan patent number 1240395 and patent publication number 200818349 which further indicate that chips on substrate units are the major factors affecting the mold flow speeds but fail to disclose the impacts of side rails of molding area located outside the substrate units during MAP.

Figure 1:
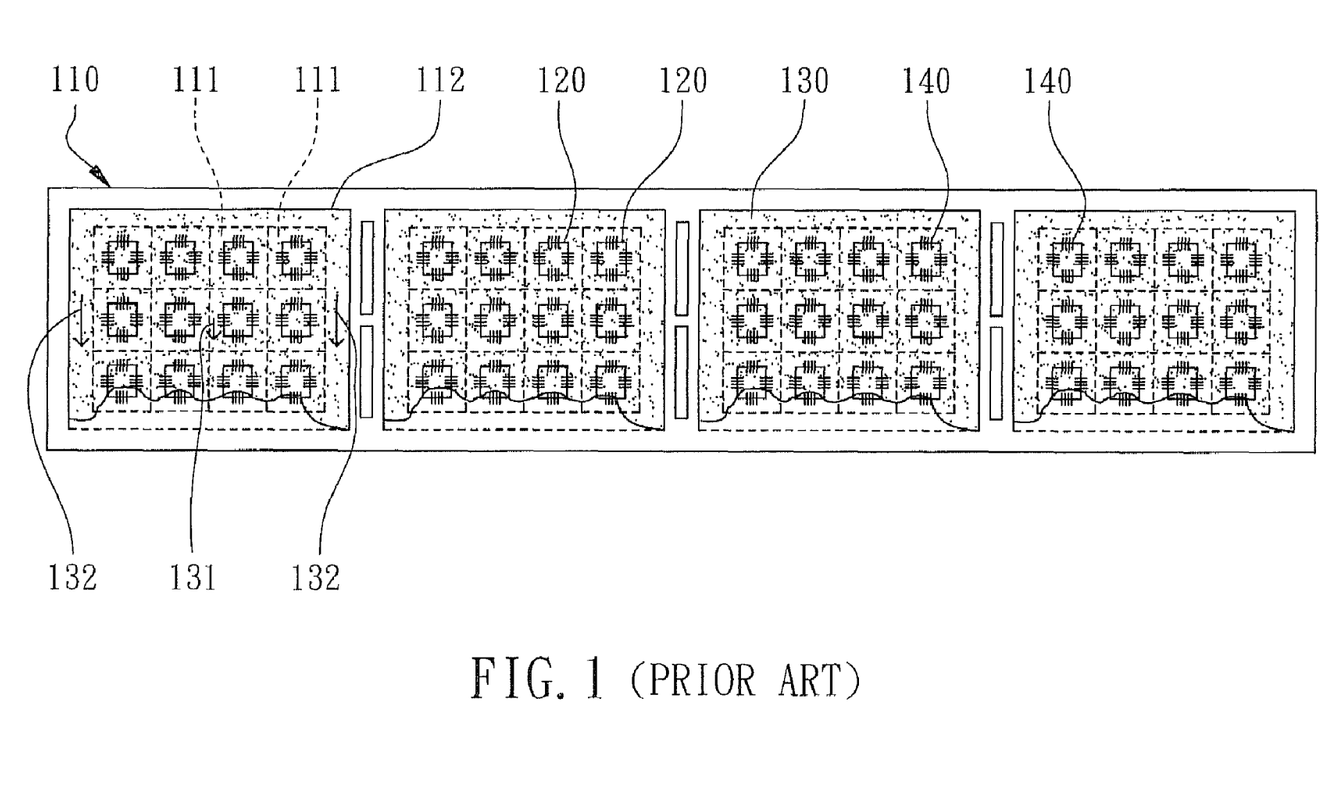
FIG. 1 is a top view of a substrate strip showing the differences of mold flow speeds at the side rails and at the center of the molding area during conventional MAP.

FIG. 1 shows conventional mold flows on a substrate strip to form an encapsulant during conventional MAP. A substrate strip 110 includes a plurality of substrate units 111 arranged in an array in each molding area 112. Usually, there are one or more molding areas 112 formed on the substrate strip 110 to define the encapsulated areas of the substrate strip 110. At least a chip 120 is disposed on each substrate unit 111 and is electrically connected to the corresponding substrate unit 111 by a plurality of bonding wires 140 or by other electrical connecting components. Several encapsulants 130 are formed on the corresponding molding areas 112 to continuously encapsulate the chips 120 in an array on the substrate units 111.

It was well known that the molding area 112 is defined by the dimension of the opening of the top mold chest of the top mold which can not be adjusted. The dimension of a top mold chest also limits the volume of the encapsulant 113 disposed on the substrate strip 110. Normally, a molding refuse ring in the peripheries of the molding area 112 are kept around the substrate units 111 in an array to make the dimension of a molding area 112 slightly larger than the one of the substrate units 111 inside the molding area 112. The top mold touches the edges of the molding refuse ring in the molding area 112 outside the substrate units 111 to avoid damaging to the substrate units 111 and to assure that every substrate unit 111 has the same volume of encapsulant 113.

When the dimensions or the locations of the chip 112 are different or the dimensions of the substrate units 111 are changed, the gaps from the edges of two parallel side rails of the molding refuse ring parallel to the mold flow direction to the closest chip is changed as well. When the gaps are larger, the speeds of mold flow 132 at the side rails inside a molding area 112 along the gaps are faster as shown in FIG. 1. The encapsulant 130 will be unevenly molded. Once the mold flow speeds 132 at the side rails are much faster than the mold flow speeds 131 at the center, and then molding issues will be encountered such as encapsulated bubbles or voids.

SUMMARY OF THE INVENTION

The main purpose of the present invention is to provide a mold array process (MAP) for manufacturing a plurality of semiconductor packages to improve the molding issues such as encapsulated bubbles or voids by tuning mold flow speeds at the side rails and at the center by utilizing a universal adjustable top mold.

According to the present invention, a mold array process (MAP) for manufacturing a plurality of semiconductor packages is revealed. Firstly, a substrate strip is provided. The substrate strip includes a plurality of substrate units where the substrate units are arranged in an array within a molding area. Then, a plurality of chips are disposed on the substrate units. Then, the chips are continuously encapsulated by an encapsulant formed on the molding area of the substrate strip by molding. An adjustable top mold is used during the molding step where the adjustable top mold has a top mold chest. By adjusting the cavity width between the two opposing sidewalls inside the top mold chest to achieve the same mold flow speeds at the side rails and at the center of the molding area.

The MAP for manufacturing semiconductor packages revealed according to the present invention has the following advantages and positive effects:

1. The cavity width between two opposing sidewalls inside the top mold chest of the adjustable top mold can be adjusted to tune the mold flow speeds at the side rails and at the center of the molding area, for example, a first distance from each of the two opposing sidewalls to the most adjacent one of the chips is equal to a second distance between the chips perpendicular to the mold flows in the molding area. Conventional molding issues of MAP such as encapsulated bubbles or voids due to different mold flow speeds at the side rails and at the center of the molding area can be eliminated where the side rails are parallel to the flowing direction of the mold flow in the molding area. Moreover, the adjustable top mold is universal which can be adjusted according to the dimensions and locations of the chips, or the dimensions of the substrate units, or the dimensions of the molding area of the substrate strip so that the mold flow speeds on two opposing side rails can be properly adjusted.
2. When the orientations of the bonding wires are different from the flowing directions of the mold flows, mold flow disturbance is induced leading to different mold flow speeds. The speeds of the mold flows at the center and at the side rails of the molding area can be made the same by adjusting the cavity width between two opposing sidewalls inside the top mold chest.
3. Since the cavity width between two opposing sidewalls inside the top mold chest of the adjustable top mold can be adjusted, the mold-release processes can easily be enhanced.
4. By using the movable part and the flexible component of the adjustable top mold, the packing pressure can be maintained to control the density of the encapsulant and bleeding of the encapsulant.

DETAILED DESCRIPTION OF THE INVENTION

Please refer to the attached drawings, the present invention is described by means of embodiment(s) below.

According to the preferred embodiment of the present invention, a mold array process (MAP) for manufacturing a plurality of semiconductor packages comprises the steps illustrated with partially top views of a substrate strip from FIG. 2A to FIG. 2D and with partially cross-sectional views of the substrate strip from FIG. 3A to FIG. 3G.

Figure 2A:
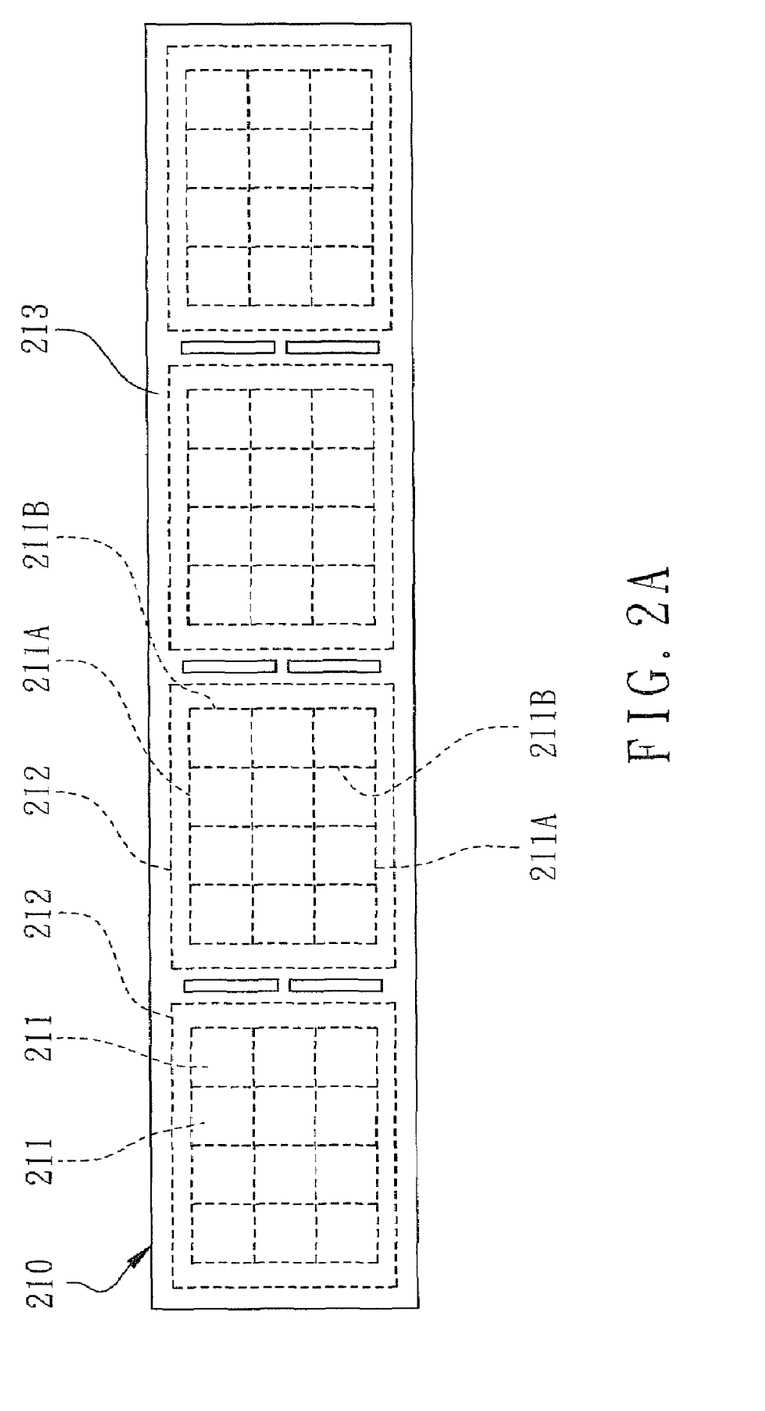
FIGS. 2A to 2D are partially top views of the substrate strip in different steps of MAP according to the first embodiment of the present invention.
Figure 2D:
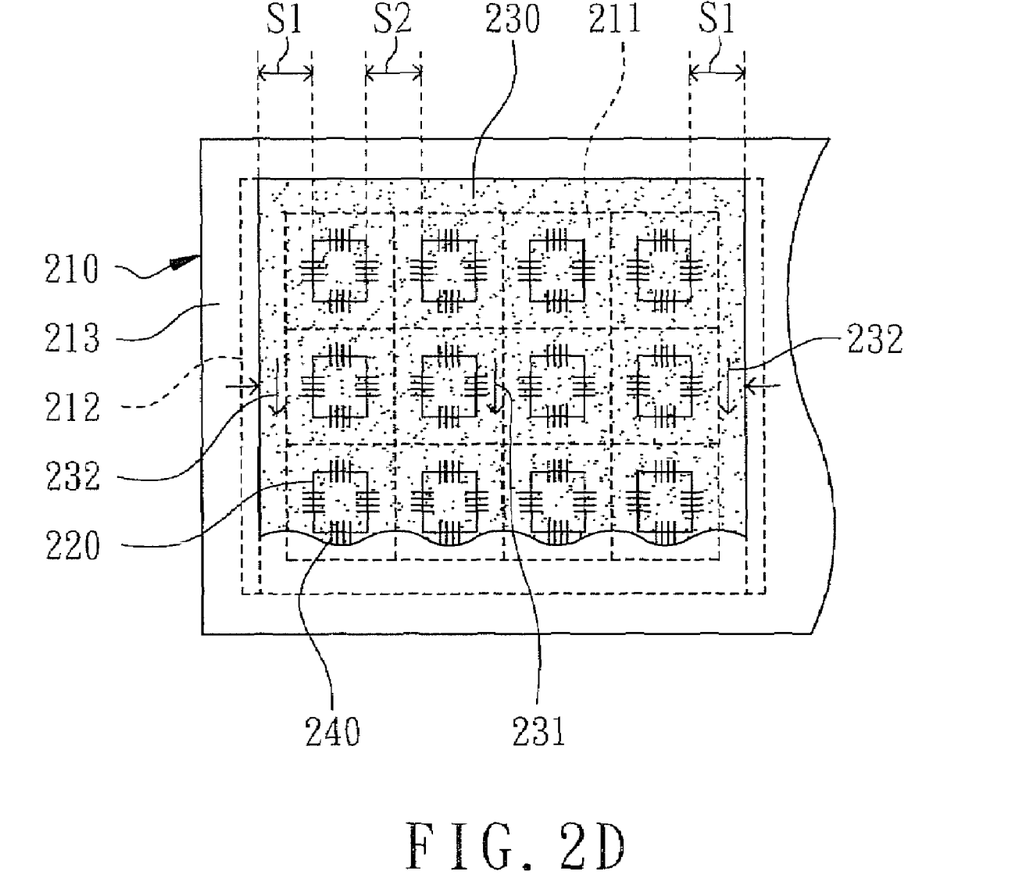
Figure 3A:
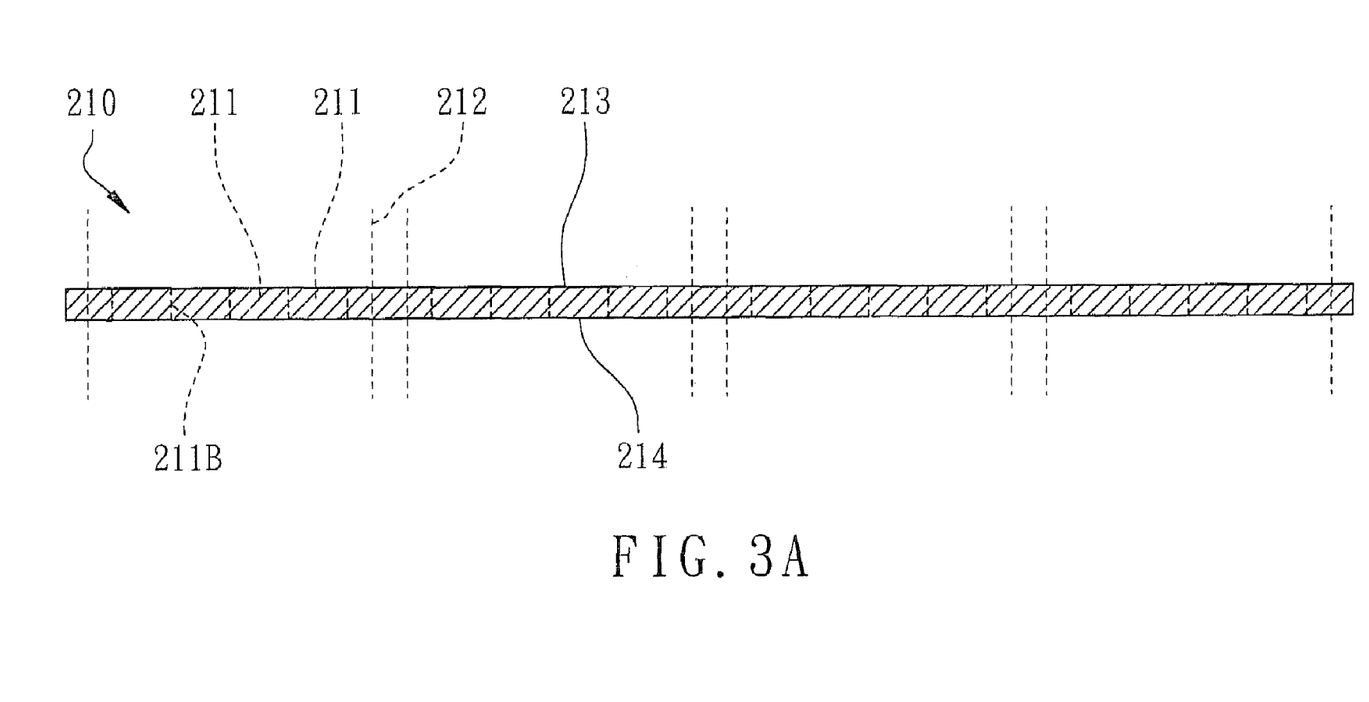
FIGS. 3A to 3G are partially cross-sectional views of the substrate strip in different steps of MAP according to the first embodiment of the present invention.

Firstly, as shown in FIG. 2A and FIG. 3A, a substrate strip 210 is provided. The substrate strip 210 includes a plurality of substrate units 211 arranged in an array inside a molding area 212. A plurality of lateral scribe lines 211A and a plurality of vertical scribe lines 211B are defined between the substrate units 211 and the peripheries of the array of the substrate units 211 where the orientation of the lateral scribe lines 211A are perpendicular to the mold flow and the orientation of the vertical scribe lines 211B is parallel to the mold flow. In the present embodiment, the substrate strip 210 has a top surface 213 and a bottom surface 214 where the top surface 213 is used for disposing an encapsulant 230 as shown in FIG. 2D and the bottom surface 214 is used for disposing a plurality of external terminals 250 such as solder balls as external connections as shown in FIG. 3F. Dimension of the molding areas 212 on the top surface 213 is slightly larger than the one of the array of the substrate units 211. Number of the molding areas 212 on the top surface 213 can be one, two, or more. In a specific embodiment but without any limitations, the top surface 213 of the substrate strip 210 includes four molding areas 212 where each molding area 212 is rectangular. Normally the substrate strip 210 is a printed circuit board with single-sided or double-sided conductive circuits. When the substrate strip 210 is a multiple-layer printed circuit board, a plurality of plated through holes (PTH) are formed in the substrate strip 210. In another embodiment, the substrate strip 210 can be chosen from flexible circuits, sawing-type leadless leadframes with back tapes, ceramic substrates, leadless leadframes, or metal carriers.

Figure 2B:
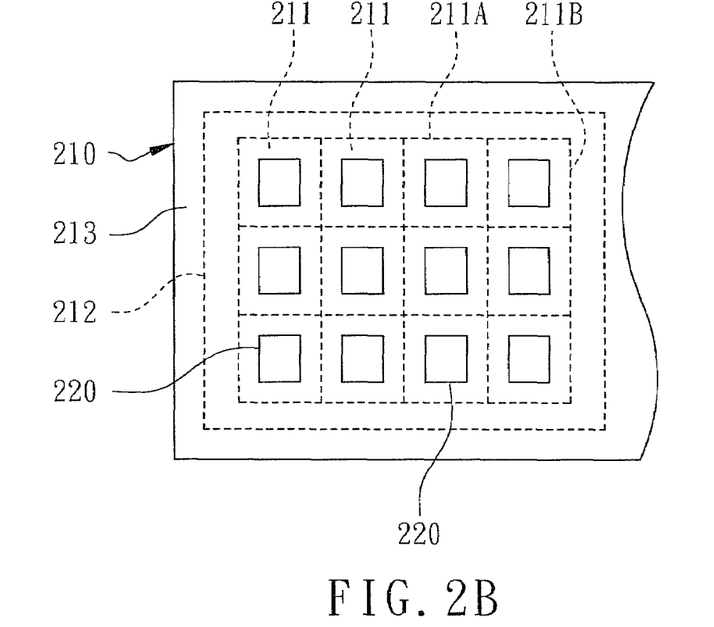
Figure 3B:
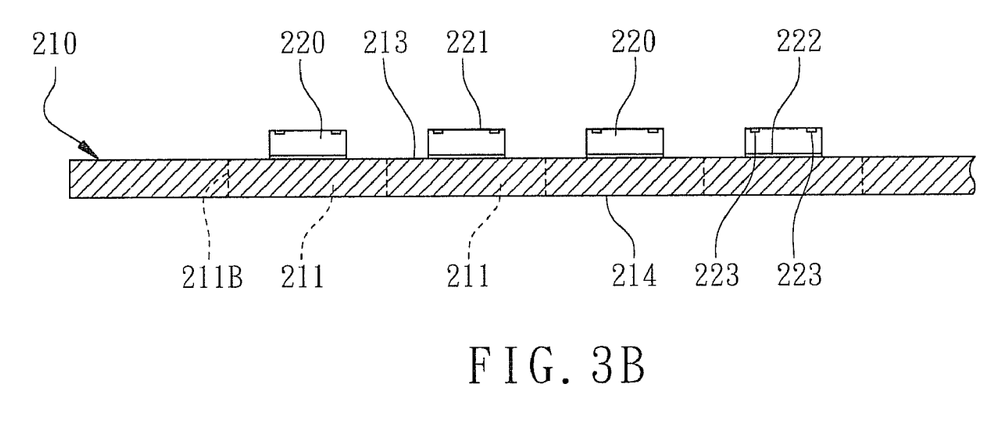

Then, as shown in FIGS. 2B and 3B, a plurality of chips 220 are disposed on the substrate units 211 on the top surface 213 by known chip bonding material. Each chip 220 has an active surface 221 and a back surface 222 where a plurality of bonding pads 223 are disposed on the active surface 221, as shown in FIG. 3B. In the present embodiment, a conventional face-up package is illustrated and implemented where the back surface 222 of the chip 220 is attached to the top surface 213 of the substrate strip 210. However, a window-type FBGA can also be implemented where the active surface 221 of the chip 220 is attached to the substrate strip 210 with a slot formed on each substrate unit 211 without covering the bonding pads 223, not shown in the figures. Moreover, a multi-chip package can also be implemented with a plurality of chips 220 stacked on top of each other and attached onto each substrate unit 211. Normally, the chips 220 are disposed at the centers of the corresponding substrate units 211.

Figure 2C:
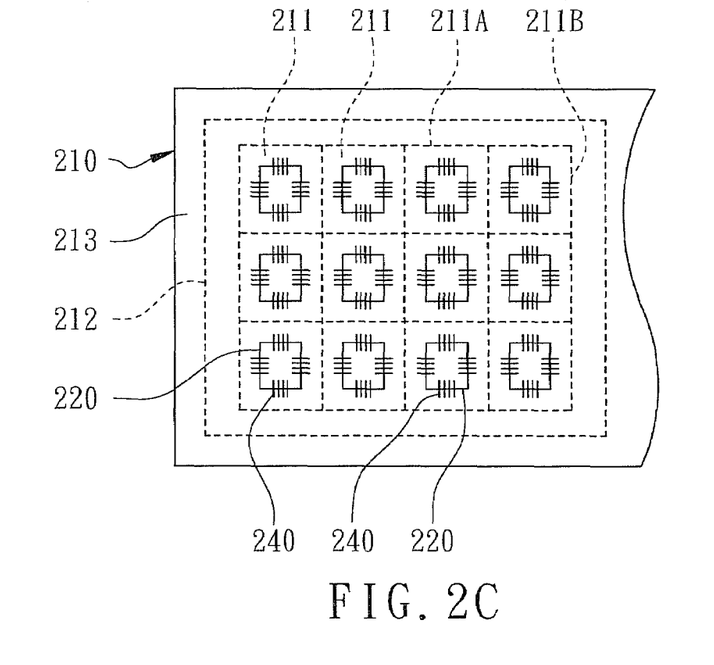
Figure 3C:
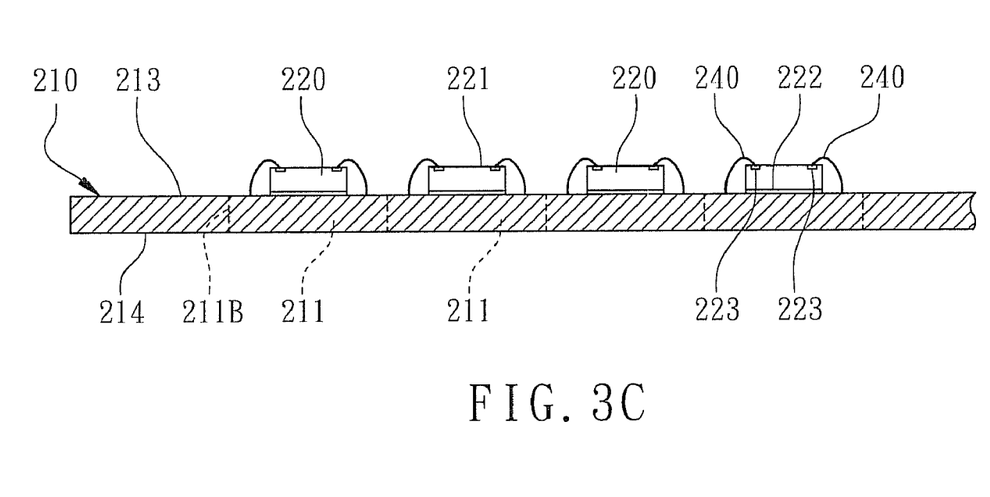

To be more specific, the MAP further comprises an electrical connection step after die attaching and before molding. As shown in FIGS. 2C and 3C, a plurality of bonding wires 240 are formed to electrically connect the bonding pads 223 of the chip 220 to the substrate strip 210. However, other electrical connecting methods besides wire bonding can be implemented to electrically connect the chip 220 to the substrate strip 210 such as flip chip bonding, inner lead bonding, etc.

Figure 3D:
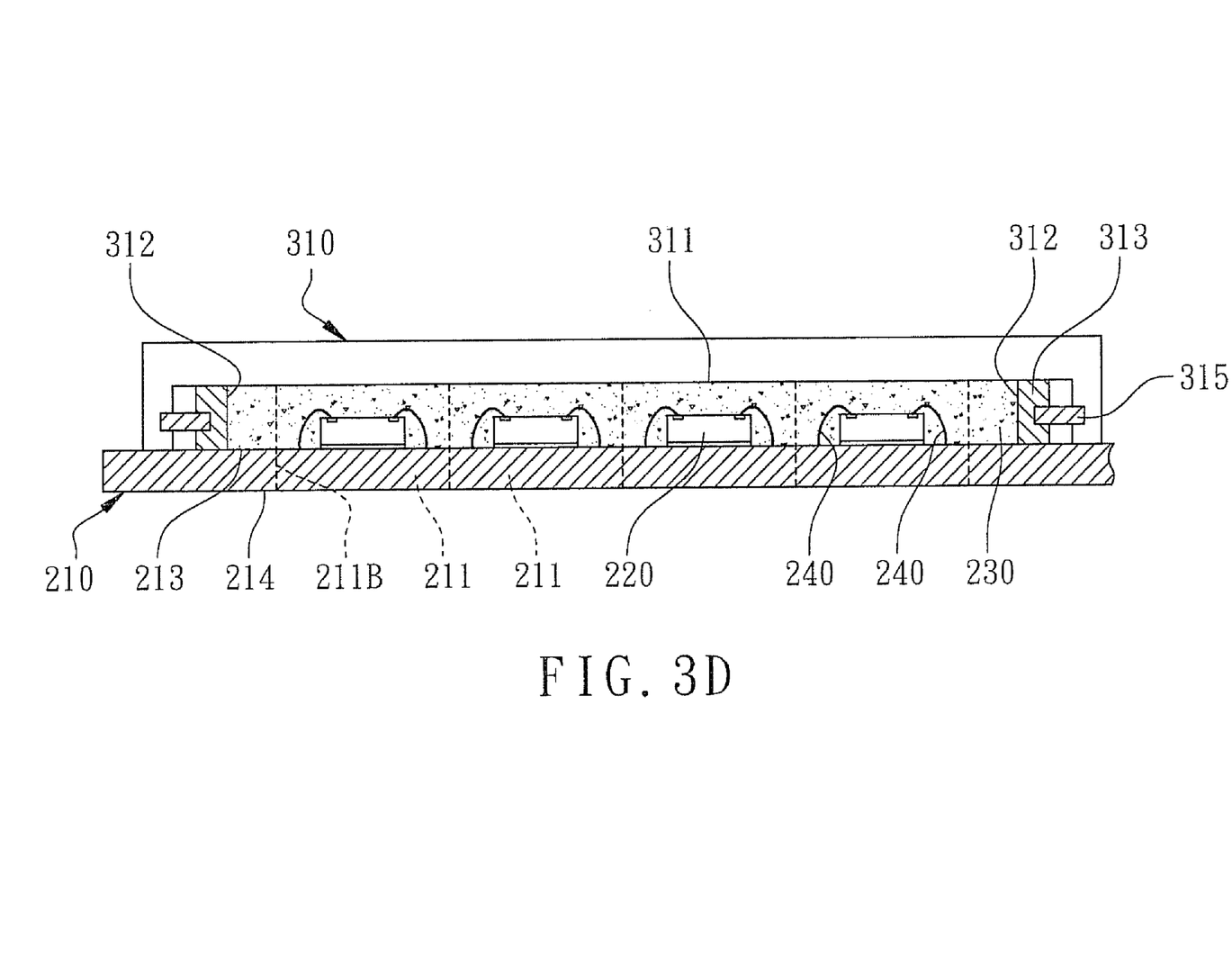
Figure 4:
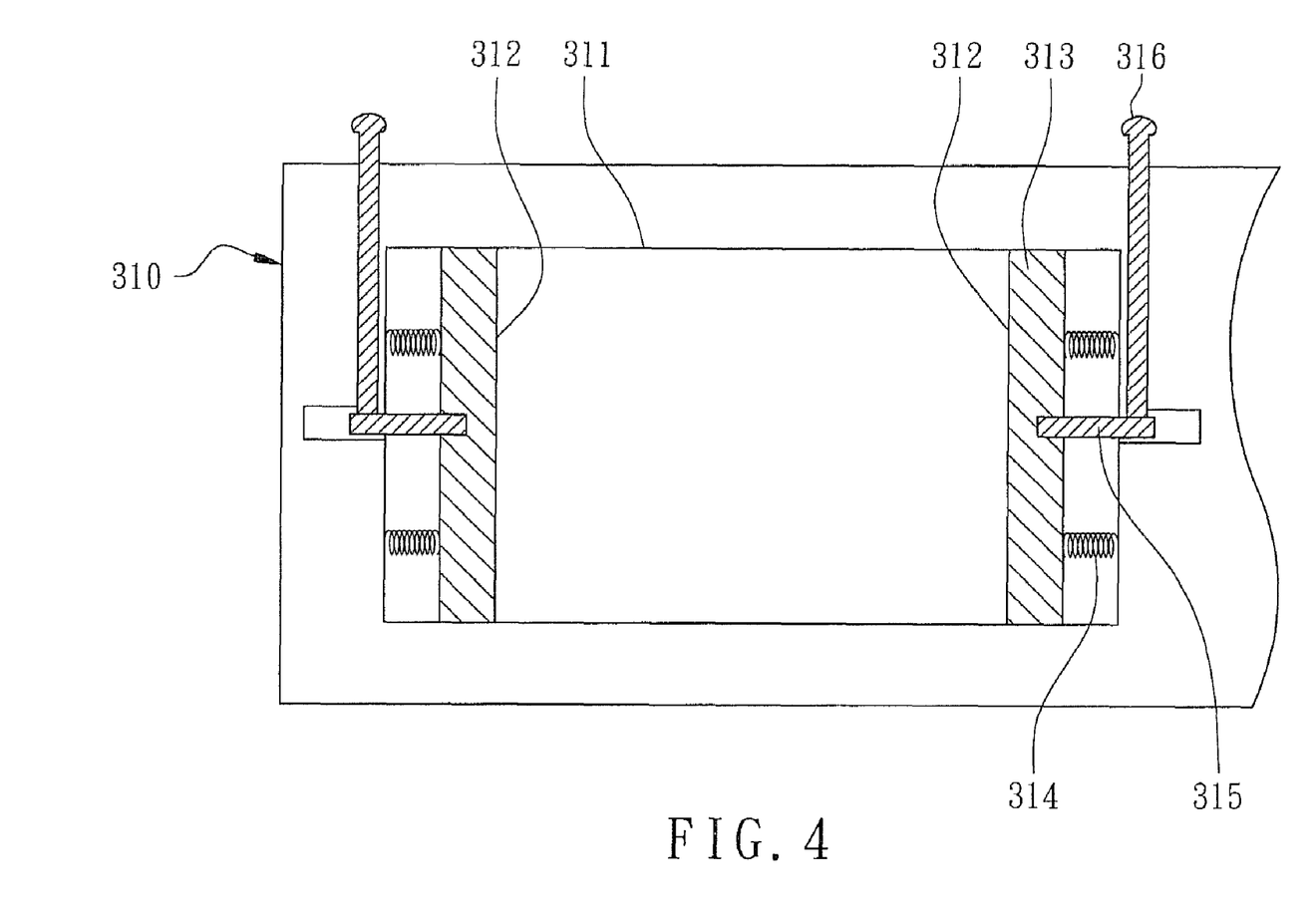
FIG. 4 is a partially bottom view of an adjustable top mold utilized in MAP according to the first embodiment of the present invention.

Then, as shown in FIG. 2D and FIG. 3D, an encapsulant 230 by molding is formed on the molding area 212 of the substrate strip 210 so that the chips 220 are encapsulated. Number of encapsulants is corresponding to the number of the molding areas 212. During the molding step, an adjustable top mold 310 is pressed on the top surface 213 of the substrate strip 210 where the bottom surface 214 of the substrate strip 210 is placed on a bottom mold, not shown in the figure. The adjustable top mold 310 has at least a top mold chest 311 in number corresponding to the molding area 212 where two opposing internal sidewalls 312 in the top mold chest 311 are parallel to the directions of the mold flows. Moreover, the cavity width between two sidewalls 312 can be adjusted, as shown in FIG. 4. By adjusting the cavity width between the two opposing sidewalls 312 of the top mold chest 311, the mold flow speeds 232 at the side rails of the molding area 211 can be made the same as the mold flow speeds 231 at the center of the molding area 211, as shown in FIG. 2D. During filling process of forming the encapsulant 230, the encapsulant 230 is formed on the molding area 212 to continuously cover the substrate units 211 and to further continuously encapsulate the chips 220. Therefore, as shown in FIG. 2D, the mold flow speeds 232 at the side rails of the molding area 211 can be changed to match the mold flow speeds 231 at the center of the molding area 211 to balance the mold flows and to avoid bubble formation at the sides of the chips during MAP. In the present embodiment, as shown in FIG. 2D, gap S1 is defined as a first distance from the two opposing sidewalls 312 to the most adjacent one of the chips 220 where gap S1 is perpendicular to the mold flow directions on the molding area 212. Gap S2 is defined as a second distance which is the spacing between the chips 220 perpendicular to the mold flow directions on the molding area 212. Since chips are the major factor affecting the mold flow speeds, therefore, by adjusting the cavity width between two opposing sidewalls 312 of the top mold chest 311 to make gap S1 equal to gap S2, as shown in FIG. 2D, the mold flow speeds 232 at the side rails of the molding area 212 are the same as the mold flow speeds 231 at the center of the molding area 212.

Figure 3E:
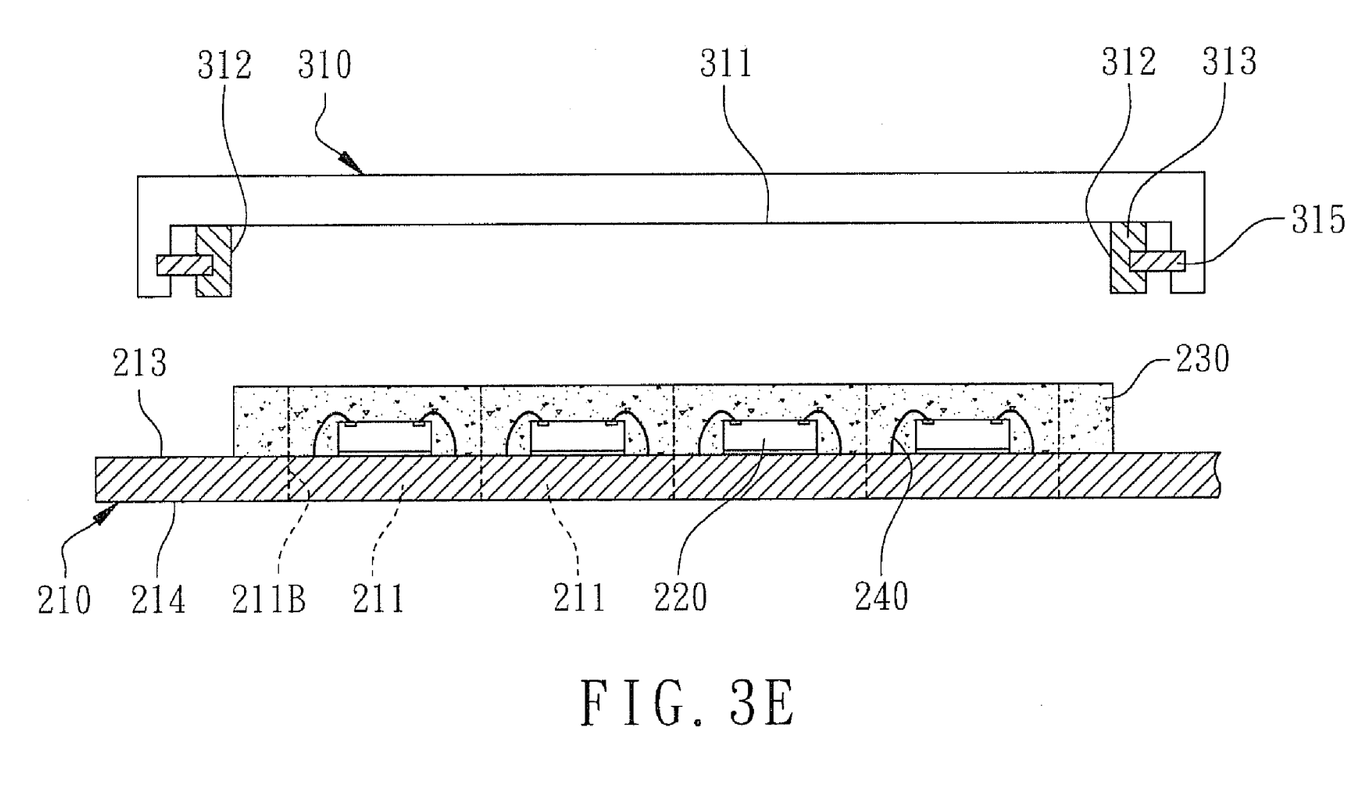
Figure 3F:
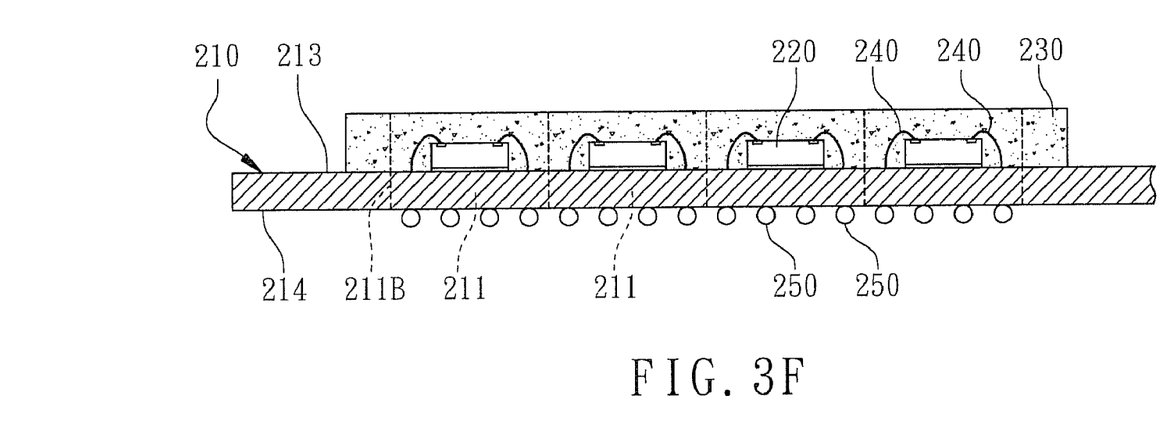

As shown in FIG. 3E, the encapsulant 230 is cured where a curing process is performed after the encapsulant 230 is formed. The adjustable top mold 310 is released from the substrate strip 210 for completely curing the encapsulant 230. Since the cavity width between two opposing sidewalls 312 of the top mold chest 311 are adjustable, mold release can easily be enhanced.

In more specific MAP, the step of disposing a plurality of external terminals can further be performed after the molding step. As shown in FIG. 3F, a plurality of external terminals 250 such as solder balls are disposed on the bottom surface 214 of the substrate strip 210. Each substrate unit 211 of the substrate strip 210 is part of a BGA semiconductor package.

Figure 3G:
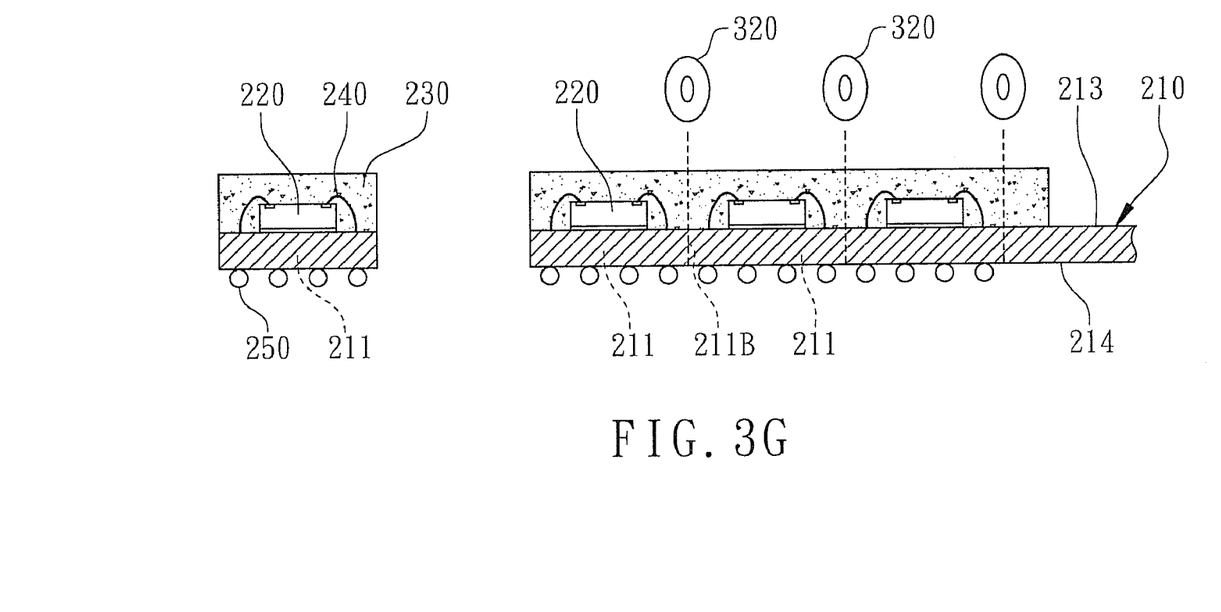

To be more specific, the step of singulating the substrate strip can further be performed after the molding step. As shown in FIG. 3G, a singulating tool 320 such as blades or laser saws along the peripheries of the substrate units 211, i.e., the lateral scribe lines 211A and vertical scribe lines 211B, and cuts through the substrate strip 210 and the encapsulant 230 to form a plurality of individual semiconductor packages.

There is no encapsulated bubble in the encapsulant 230 at the sides of the chip 220 in each singulated semiconductor package.

The MAP according to the present invention are implemented in mass production of BGA packages and can also be further implemented in the mass production of LGA packages, QFN packages, SON packages, BCC packages, etc.

As shown in FIG. 4, in one embodiment, the adjustable top mold 310 includes a plurality of movable block 313 on which the sidewalls 312 of the top mold chest 311 are formed. The cavity width between two opposing sidewalls 312 is adjusted by sliding the movable blocks 313. Each movable block 313 is formed at one of the sidewalls 312 of the top mold chest 311. To be more specific, the two movable blocks 313 are symmetrically disposed to form the two opposing sidewalls 312. The adjustable top mold 310, for example, can further include a plurality of threaded shafts 315 connected with the movable blocks 313 to adjust the positions of the movable blocks 313. Each connected threaded shaft 315 is geared with an adjustable threaded shaft 316. In the present embodiment, one end of the adjustable threaded shafts 316 is extended toward one side of the adjustable top mold 310. By rotating the adjustable threaded shafts 316, the positions of the connected threaded shafts 315 and the movable blacks 313 can be changed. Preferably, the adjustable top mold 310 further includes a plurality of flexible components 314 firmly pressing the movable blocks 313. Therefore, by using the movable blocks 313 and the flexible components 314 of the adjustable top mold 310, the packing pressure can be detected and adjusted to maintain a suitable packing pressure pressed on the melting compound to increase the density of the encapsulant and to further control bleeding of the encapsulant. The above mentioned adjustable top mold 310 is one of the mechanisms to adjust the cavity width between the internal sidewalls of a top mold chest without restricting the present invention.

Figure 5:
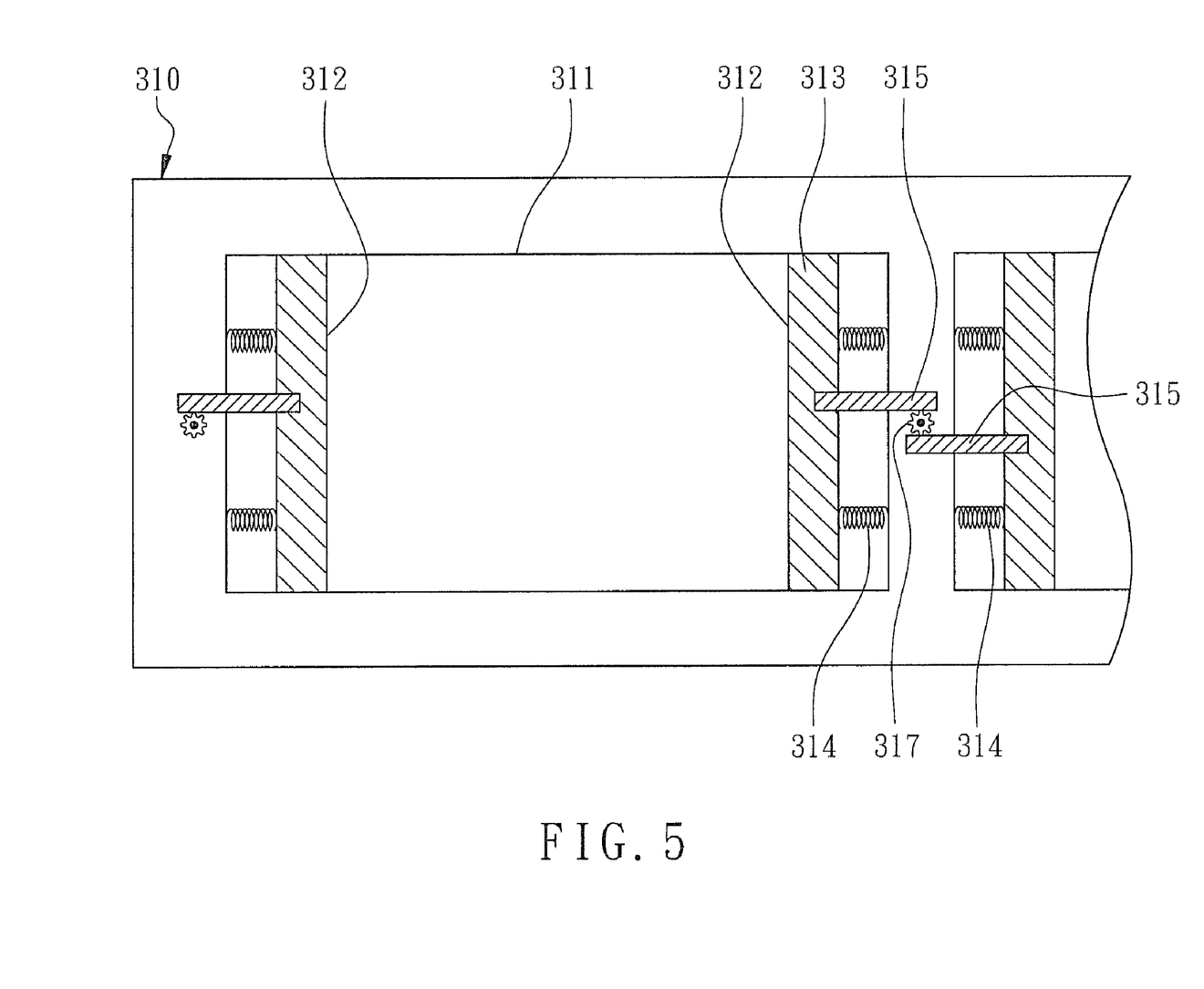
FIG. 5 is a partially bottom view of another adjustable top mold utilized in MAP according to the first embodiment of the present invention.

As shown in FIG. 5, in another embodiment, the adjustable top mold 310 further include an adjustable mechanism not only including the movable blocks 313 and the connected threaded shaft 315 but also further including a plurality of fine-tuned gears 317 for fine tuning the positions of the movable blocks 313. The fine-tuned gears 317 are geared with the connected threaded shafts 315. The shafts of the fine-tuned gears 317 are extended toward top surface of the adjustable top mold 310. By rotating the shafts of the fine-tuned gears 317, the positions of the connected threaded shafts 315 and the movable blocks 313 can be changed. In a preferred mechanism, the adjacent connected threaded shafts 315 in another top mold chest 311 can also be geared to the same fine-tuned gear 317 to achieve synchronized fine-tune processes.

Therefore, the cavity width between the two opposing sidewalls 312 inside the top mold chest 311 of the adjustable top mold 310 can be adjusted to change the dimensions of the molding area 212, i.e., the covering areas of the encapsulant on the substrate strip 210 to make the adjustable top mold 310 universal and adjustable according to the dimensions and the positions of the chips, or the dimensions of the substrate units, or the dimensions of the molding area of the substrate strip to avoid higher mold flow speeds at the side rails of the molding area 212.

Figure 6:
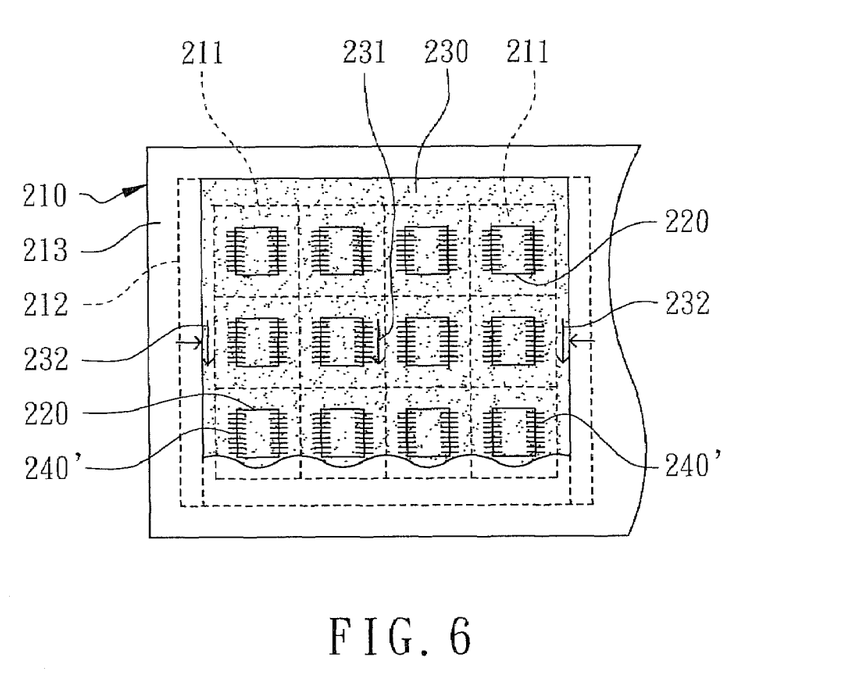
FIG. 6 is a partially top view of a substrate strip in molding step of MAP according to the second embodiment of the present invention.
Figure 7:
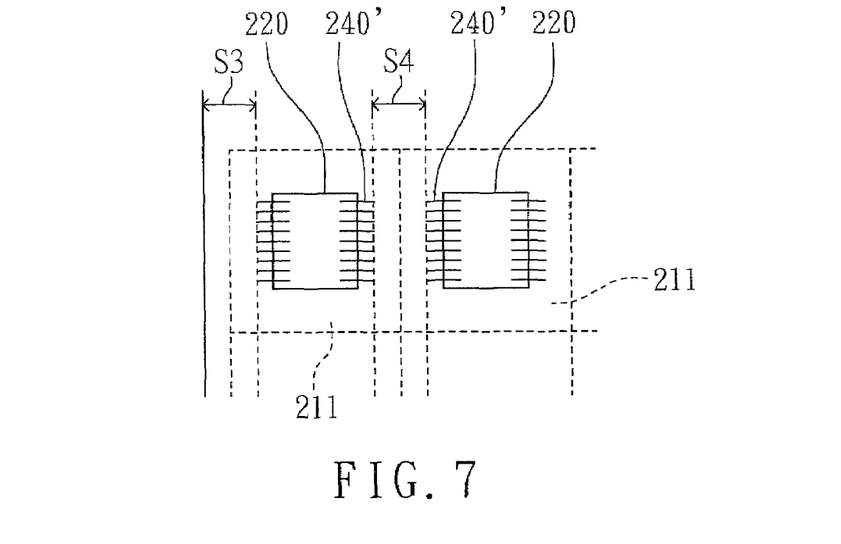
FIG. 7 is an enlarged view of FIG. 6 according to the second embodiment of the present invention.

According to the second embodiment of the present invention, anther MAP for semiconductor devices are illustrated with a partial top view in FIG. 6 and with a partially enlarged view in FIG. 7. The major steps of MAP are the same as the ones of the first embodiment, such as "providing a substrate strip", "disposing a plurality of chips on the substrate units", "forming a plurality of bonding wires", and "forming an encapsulant on the molding area of the substrate strip". During MAP, an adjustable top mold 310 having a top mold chest 311 is implemented where the cavity width between the opposing sidewalls 312 inside the top mold chest 311 can be adjusted to make the mold flow speeds 232 at the side rails of the molding area 212 be equal to the mold flow speeds 231 at the center of the molding area 212.

When a plurality of bonding wires 240' are closely bonded in high densities with the orientation of the bonding wires 240' different from the directions of the mold flows, then the major factors affecting the mold flow speeds are the chips 220 and the bonding wires 240'. As shown in FIG. 7, in the present embodiment, gap S3 is defined as a first distance from each of the two opposing sidewalls to the most adjacent bonding wires 240'connecting the chips 220. Gap S3 is perpendicular to the mold flow directions on the molding area 212. Gap S4 is defined as a second distance of the bonding wires between two adjacent chips 220. Gap S4 is also perpendicular to the mold flows on the molding area. By adjusting the cavity width between two sidewalls 312 of the top mold chest 311, gap S3 is equal to gap S4. Accordingly, the mold flow speeds 232 at the side rails of the molding area 212 are equal to the mold flow speeds 231 at the center of the molding area 212 to avoid encapsulated bubbles inside the encapsulant 230.

The above description of embodiments of this invention is intended to be illustrative but not limiting. Other embodiments of this invention will be obvious to those skilled in the art in view of the above disclosure.

What is claimed is:

1. A mold array process (MAP) for manufacturing a plurality of semiconductor packages, primarily comprising the steps of:
   providing a substrate strip including a plurality of substrate units arranged in an array inside a molding area;
   disposing a plurality of chips on the substrate units; and
   forming an encapsulant on the molding area of the substrate strip by molding, the encapsulant continuously encapsulates the chips by an adjustable top mold, wherein the adjustable top mold has a top mold chest with a cavity width between two opposing sidewalls in the top mold chest, wherein the cavity width is adjusted in a manner that the mold flow speeds at the side rails and at the center of the molding area are made the same.

2. The process as claimed in claim 1, wherein a first distance from each of the two opposing sidewalls to the most adjacent one of the chips is equal to a second distance between the chips perpendicular to the mold flows on the molding area.

3. The process as claimed in claim 1, wherein the adjustable top mold includes two movable blocks on which the sidewalls of the top mold chest are formed, wherein the cavity width between two opposing sidewalls is adjusted by sliding the movable blocks.

4. The process as claimed in claim 3, wherein the adjustable top mold includes a plurality of flexible components firmly pressing the movable blocks.

5. The process as claimed in claim 3, wherein the adjustable top mold includes a plurality of threaded shafts connected with the movable blocks.

6. The process as claimed in claim 3, wherein the adjustable top mold includes a plurality of fine-tuned gears for fine-tuning the positions of the movable blocks.

7. The process as claimed in claim 1, further comprising the step of forming a plurality of bonding wires electrically connecting the chips to the substrate strip before the step of forming the encapsulant.

8. The process as claimed in claim 7, wherein a first distance from each of the two opposing sidewalls to the most adjacent bonding wires connecting the chips is equal to a second distance of the bonding wires between the chips perpendicular to the mold flows on the molding area by adjusting the cavity width between the two opposing sidewalls when the orientations of the bonding wires are different from the direction of the mold flows causing mold flow disturbances.

9. The process as claimed in claim 1, further comprising the step of disposing a plurality of external terminals on a bottom surface of the substrate strip after the step of forming the encapsulant.

10. The process as claimed in claim 9, wherein the external terminals include a plurality of solder balls.

11. The process as claimed in claim 1, further comprising the step of singulating the substrate units to cut through the substrate strip and the encapsulant after the step of forming the encapsulant.

* * * * *